(12) United States Patent
Viereck et al.

(10) Patent No.: US 11,788,879 B2
(45) Date of Patent: Oct. 17, 2023

(54) STATE ANALYSIS OF AN INDUCTIVE OPERATING RESOURCE

(71) Applicant: Maschinenfabrik Reinhausen GmbH, Regensburg (DE)

(72) Inventors: Karsten Viereck, Regensburg (DE); Anatoli Saveliev, Zeitlarn (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 120 days.

(21) Appl. No.: 17/053,099

(22) PCT Filed: May 15, 2019

(86) PCT No.: PCT/EP2019/062514
§ 371 (c)(1),
(2) Date: Jun. 8, 2021

(87) PCT Pub. No.: WO2019/219761
PCT Pub. Date: Nov. 21, 2019

(65) Prior Publication Data
US 2021/0293899 A1 Sep. 23, 2021

(30) Foreign Application Priority Data
May 18, 2018 (DE) ...................... 10 2018 112 003.6

(51) Int. Cl.
*G01H 3/00* (2006.01)
*G01R 31/62* (2020.01)
(Continued)

(52) U.S. Cl.
CPC ............... *G01H 3/00* (2013.01); *G01P 15/00* (2013.01); *G01R 31/62* (2020.01); *G01R 31/72* (2020.01)

(58) Field of Classification Search
CPC . G01H 3/00; G01H 1/00; G01P 15/00; G01R 31/62; G01R 31/72; G01R 15/18
See application file for complete search history.

(56) References Cited

U.S. PATENT DOCUMENTS

| 6,507,790 B1 | 1/2003 | Radomski et al. |
| 7,089,145 B2 * | 8/2006 | Stenestam .......... G01R 31/3274 702/136 |

(Continued)

FOREIGN PATENT DOCUMENTS

| CN | 103149476 A | 6/2013 | |
| DE | 102007036214 A1 * | 6/2008 | ............. G01G 23/01 |

(Continued)

OTHER PUBLICATIONS

Machine translation of DE102016122081A1 (Year: 2018).*
(Continued)

*Primary Examiner* — Eman A Alkafawi
*Assistant Examiner* — Sangkyung Lee
(74) *Attorney, Agent, or Firm* — LEYDIG, VOIT & MAYER, LTD.

(57) ABSTRACT

A system analyzes a state of an inductive operator. The system includes a measuring device that is configured to: detect an acoustic reference signal and a plurality of operating variables, which can change over time, of the inductive operator or a reference inductive operator during a reference time period; and detect an acoustic signal and the operating variables during a productive time period. The system also includes an evaluating device that is configured to: generate a reference data set from the reference signal and a productive data set from the acoustic signal; perform a regression analysis of the reference data set and thereby create a model for description of the acoustic reference signal by the operating variables; and generate a state evaluation of the (Continued)

inductive operator from a difference between the productive data set and values modelled in accordance with the model.

14 Claims, 2 Drawing Sheets

(51) Int. Cl.
*G01R 31/72* (2020.01)
*G01P 15/00* (2006.01)

(56) References Cited

U.S. PATENT DOCUMENTS

| | | |
|---|---|---|
| 7,567,878 B2 | 7/2009 | Yuan et al. |
| 8,584,515 B2 | 11/2013 | Fischer et al. |
| 2003/0220767 A1 | 11/2003 | Wegerich |
| 2014/0174185 A1 | 6/2014 | Kreischer et al. |
| 2016/0181024 A1* | 6/2016 | Hammer ................ G05F 1/147 323/341 |

FOREIGN PATENT DOCUMENTS

| | | | |
|---|---|---|---|
| DE | 102008042556 A1 | 4/2010 | |
| DE | 102009014333 A1 | 9/2010 | |
| DE | 102016122081 A1 * | 5/2018 | ............. G01H 11/06 |
| EP | 1786083 A1 | 5/2007 | |
| JP | 10133740 A | 5/1998 | |
| JP | 2006090904 A | 4/2006 | |
| JP | 2016045793 A | 4/2016 | |
| WO | WO-9738292 A1 * | 10/1997 | ........... B23Q 17/098 |
| WO | WO 2016168621 A1 | 10/2016 | |
| WO | WO-2018065189 A1 * | 4/2018 | ............. H01F 27/02 |

OTHER PUBLICATIONS

Machine translation of WO2018065189A1 (Year: 2018).*
Machine translation of DE102010053100 A1 (Year: 2011).*
B. Garcia et al: "Transformer Tank Vibration Modeling as a Method of Detecting Winding Deformations—Part II: Experimental Verification", IEEE Transactions on Power Delivery., vol. 21, Nr. 1, Dec. 27, 2005 (Dec. 27, 2005), pp. 164-169, XP055546052.

* cited by examiner

STATE ANALYSIS OF AN INDUCTIVE OPERATING RESOURCE

CROSS-REFERENCE TO PRIOR APPLICATIONS

This application is a U.S. National Phase Application under 35 U.S.C. § 371 of International Application No. PCT/EP2019/062514, filed on May 15, 2019, and claims benefit to German Patent Application No. DE 10 2018 112 003.6, filed on May 18, 2018. The International Application was published in German on Nov. 21, 2019, as WO 2019/219761 A1 under PCT Article 21(2).

FIELD

The invention relates to a method for analysis of the state of inductive operating means, to a system for analysis of the state of inductive operating means and to inductive operating means with such a system.

BACKGROUND

In order to analyse the state of inductive operating means such as, for example, a power transformer in an energy supply mains or a choke, it was hitherto necessary periodically to carry out measurements or investigations directly at the active part of the inductive operating means. For that purpose, for example, the tension force of the windings can be checked, which is usually very complicated because the operating means is typically located in a vessel filled with an insulating substance. In addition, the operating means must, for checking, be removed from the mains. Also, complex measurements such as a dynamic resistance measurement or a frequency response analysis (FRA) are, for a start, complicated and similarly require separation of the operating means from the mains.

SUMMARY

An embodiment of the present invention provides a system that analyses a state of an inductive operator. The system includes a measuring device that is configured to: detect an acoustic reference signal and a plurality of operating variables, which can change over time, of the inductive operator or a reference inductive operator during a reference time period; and detect an acoustic signal and the operating variables during a productive time period. The system also includes an evaluating device that is configured to: generate a reference data set from the reference signal and a productive data set from the acoustic signal; perform a regression analysis of the reference data set and thereby create a model for description of the acoustic reference signal by the operating variables; and generate a state evaluation of the inductive operator from a difference between the productive data set and values modelled in accordance with the model.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
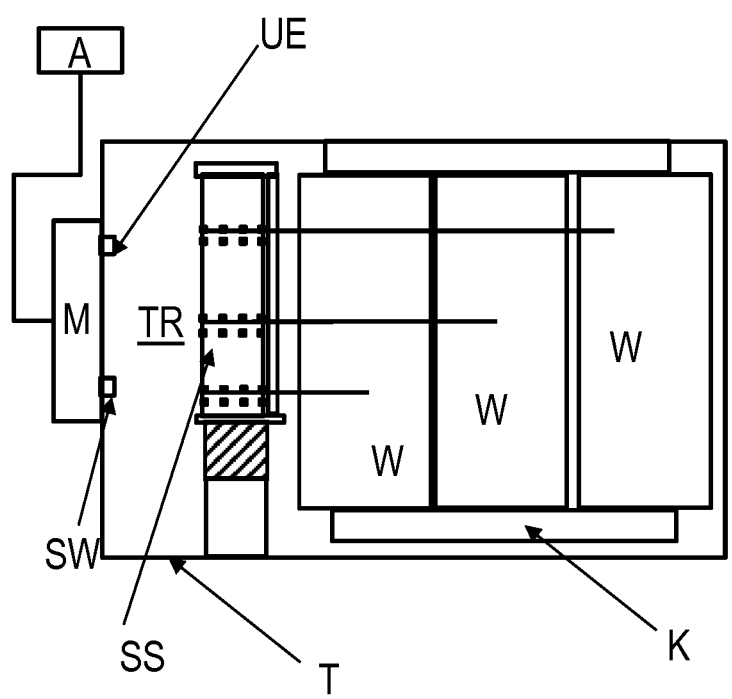
FIG. 1 shows a block diagram of operating means with an exemplifying system.

Embodiments of the present invention provide an improved concept for the analysis of the state of inductive operating means, which simplifies the state analysis.

Embodiments of the present invention are based on the idea of recording an acoustic reference signal as well as operating variables, which change with time, of the operating means during a reference time period and creating therefrom a regression model which describes the acoustic reference signal by the operating variables as independent variables. During productive operation, an acoustic signal and the operating variables are again recorded. The state of the operating means is then evaluated on the basis of a difference of a productive data set from modelled values.

According to an embodiment of the present invention, a method for analysis of the state of inductive operating means is provided. For that purpose, an acoustic reference signal and a plurality of operating variables, which can change over time, of the operating means or of a reference operating means are detected during a reference time period. The reference operating means can, for example, be constructed identically to the operating means. A reference data set is generated from the reference signal. Based on the reference data set, a regression analysis is produced, and a model for description of the acoustic reference signal by the operating variables is created therefrom. During a productive time period an acoustic signal, thus an acoustic productive signal, and the operating variables are detected. A productive data set is generated from the acoustic signal detected during the productive time period. A difference between the productive data set and those values arising as a consequence of the model is then determined. A state evaluation is carried out from the difference.

The difference represents a difference of a reference state or target state of the operating means from the actual state of the operating means during the productive time period.

The operating means or reference operating means is in operation during the reference time period as well as during the productive time period.

The productive time period and the reference time period can overlap in different forms of embodiment. In particular, the reference time period can also be a productive time period of the operating means or reference operating means.

According to at least one form of embodiment, the state of the reference operating means or of the operating means during the reference time period corresponds with a desired state. The desired state can correspond, for example, with a state shortly after maintenance or shortly after original manufacture of the reference operating means or of the operating means.

According to at least one form of embodiment, the regression analysis is carried out with use of the operating variables as independent regression variables.

According to at least one form of embodiment, the values resulting as a consequence of the model, thus the values modelled according to the model, are determined on the basis of the operating variables detected during the productive time period.

According to at least one form of embodiment, the method comprises detection of at least one further acoustic signal and the operating variables during at least one further productive time period. At least one further productive data set is generated from the at least one further acoustic signal. At least one further evaluation of the state of the operating means is generated from corresponding differences between the at least one further productive data set and values modelled in accordance with the model.

According to at least one form of embodiment, the method comprises determination of a trend of the state of the operating means from the state evaluation and the at least one further state evaluation.

According to at least one form of embodiment, the reference data set is updated on the basis of the productive data set and/or the at least one further productive data set. The model is updated by means of regression analysis of the updated reference data set.

According to at least one form of embodiment, the method comprises proposing and/or undertaking an action at the operating means in dependence on the state evaluation and/or the at least one further state evaluation and/or the state trend.

The action can comprise, for example, maintenance, checking, flagging or shutdown of the operating means. The action can comprise, for example, separating the operating means from an energy supply network, for example automatically. The action can comprise, for example, an additional, in particular detailed, measurement, for example directly at the active part.

It is thus possible by means of the method to perform an evaluation of the state of the operating means without complex and complicated physical measurements directly at the active part of the operating means. Advantageously, the operating variables of the operating means are detected, for example, in the context of routine monitoring of the operating means. The additional information about the acoustic signal and the processing thereof with inclusion of the operating variables therefore allow continuous and simple evaluation of the state.

According to at least one form of embodiment, detection of the acoustic signal and/or of the acoustic reference signal is carried out by means of a sound transducer or an acceleration sensor. The sound transducer or acceleration sensor is in that case arranged at the operating means or in the interior of the operating means or at an active part of the operating means. In forms of embodiment in which use is made of reference operating means, the sound transducer for detection of the reference signal is arranged at the operating means or in the interior of the operating means or at an active part of the operating means.

According to at least one form of embodiment, the sound transducer or acceleration sensor is an electromagnetic, piezoelectric or piezoresistive sound transducer and/or a micro-electromechanical sensor (MEMS).

According to at least one form of embodiment, generation of the productive data set comprises determination of a characteristic data set. The characteristic data set corresponds with the time plot of an amplitude of a predetermined frequency component of the acoustic signal. This applies analogously to the reference data set. The predetermined frequency components can correspond with, for example, anticipated resonances or poles or multiples thereof.

According to at least one form of embodiment, detection of the operating variables is carried out by means of at least one sensor and/or at least one observation device or monitoring device.

According to at least one form of embodiment, the operating variables comprise at least one of the following variables of the operating means or of the reference operating means: an insulating means temperature, an oil temperature, a hot-spot temperature, a winding temperature, an ambient temperature, a load current, an operating voltage, a setting of a tap changer of the operating means, or reference operating means. The operating variables preferably comprise a plurality of the said variables. A higher degree of accuracy of the model can thereby be achieved.

According to at least one form of embodiment, the regression analysis comprises a linear regression analysis, particularly a multiple linear regression analysis. In that case, the reference data set derives from a linear combination of the operating variables.

According to at least one form of embodiment, the operating means comprises a transformer, particularly a power transformer, or a choke, for example a regulable choke, particularly a variable shunt reactor (VSR). The transformer or choke can be, for example, part of an energy supply network.

In addition, a system for analysis of the state of an inductive operating means is provided. The system comprises a measuring device and an evaluating device. The measuring device is arranged for the purpose of detecting an acoustic reference signal and a plurality of operating variables, which can change over time, of the operating means or a reference operating means during a reference time period. In addition, the measuring device is arranged for the purpose of detecting an acoustic signal and the operating variables during a productive time period. The evaluating device is arranged for the purpose of generating a reference data set from the reference signal and a productive data set from the acoustic signal and carrying out a regression analysis of the reference data set. The evaluating unit is arranged for the purpose of creating, by means of the regression analysis, a model for description of the acoustic reference signal by the operating variables and generating an evaluation of the state of the operating means from a difference between the productive data set and values modelled in accordance with the model.

According to at least one form of embodiment, the measuring device for detection of the acoustic signal comprises a sound transducer or an acceleration sensor which is arranged at the operating means or in the interior of the operating means or at an active part of the operating means.

According to at least one form of embodiment, the measuring device for detection of the operating variables comprises at least one sensor and/or at least one monitoring device.

According to the improved concept, there is additionally indicated inductive operating means, particularly a transformer or choke, comprising a system for state analysis in accordance with the improved concept.

Further forms of embodiment and implementations of the system and of the inductive operating means are directly evident from the various forms of embodiment of the method.

The invention is explained in the following by way of exemplifying forms of embodiment with reference to the drawings.

FIG. 1 shows inductive operation means, which here is formed, merely by way of example, as a transformer TR, particularly power transformer, and is equipped with a system for analysis of the state of the operating means in accordance with the improved concept.

The transformer TR comprises a tank or vessel T which, for example, is filled with an insulating medium, particularly insulating liquid, for example transformer oil. The active part of the transformer TR is arranged in the interior of the tank T, particularly the transformer core K as well as transformer windings W. In addition, disposed in the interior of the tank T is, for example, a tap changer SS for switching over between different winding taps.

The system for state analysis comprises a measuring device M, which comprises, for example, a sound transducer SW as well as a sensor UE. The system additionally comprises an evaluating device A, which is connected by cable or in cable-free manner with the measuring device M. The evaluating device A can be arranged at the transformer TR or remotely from the transformer TR. Parts of the measuring device M can similarly be arranged at the transformer TR or remotely therefrom.

The sound transducer SW is, for example, arranged at an outer surface of the tank T. In alternative forms of embodiment, it may be required for the sound transducer SW to be arranged within the tank T. The sensor UE is arranged, depending on the kind of sensor UE or the operating variables detectable by that, either within the tank T (for example in the case of measurement of a winding temperature or an oil temperature) or outside the tank (for example in the case of measurement of an operating voltage or an ambient temperature).

The measuring device M can include an acceleration sensor, alternatively or additionally to the sound transducer SW, and an observation or monitoring device, alternatively or additionally to the sensor UE.

In the context of a method according, the sound transducer SW or acceleration sensor detects, during a reference time period, an acoustic reference signal which represents an image of the operating noise of the transformer TR.

In parallel therewith the sensor UE or the monitoring device detects one or more operating variables of the transformer TR as a function of time, for example, insulating medium temperature, ambient temperature, load current, operating voltage, setting of the tap changer SS, and/or further operating parameters.

The evaluating device A generates from the reference signal a reference data set and performs a regression analysis of the reference data set. Based thereon, a model for description of the acoustic reference signal by the operating variables is created.

Figure 2A:
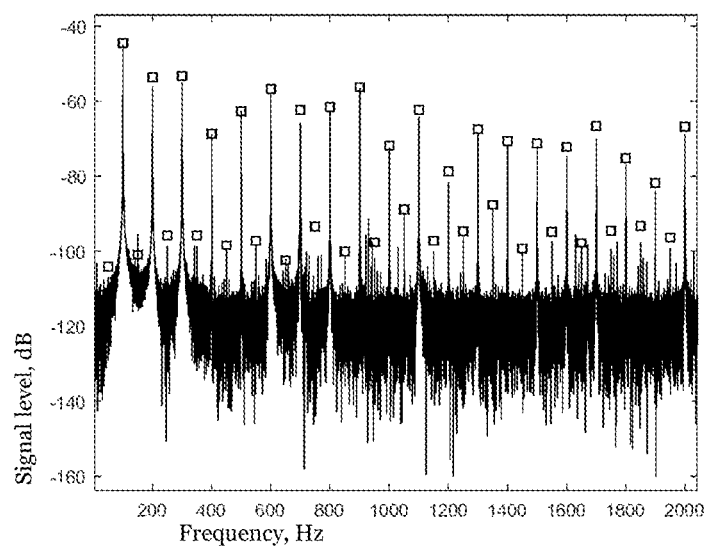
FIGS. 2A and 2B show data sets obtained from an exemplifying method.

During a production time period lying after the reference time period the sound transducer SW or acceleration sensor detects an acoustic productive signal which similarly represents an image of the operating noise of the transformer TR, but at a later point in time. In FIG. 2A a frequency spectrum of the operating noise of an operating means is shown by way of example.

In parallel therewith, the sensor UE or the monitoring device detects those operating variables, which were also detected during the reference time period or a part thereof.

Figure 2B:
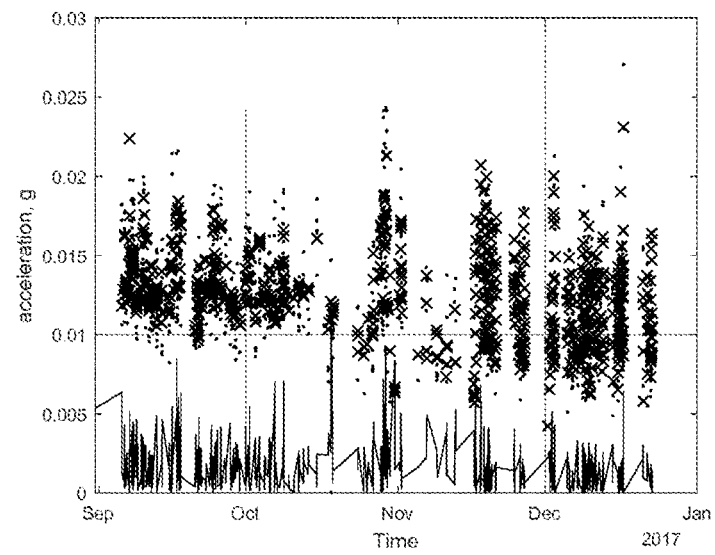

The evaluating device generates a reference data set from the reference signal and a productive data set from the acoustic signal. For that purpose, for example, the physical variables (for example, acceleration g) measured by the sensor UE or a variable, which is derived therefrom, as a function of time for a characteristic frequency or a characteristic frequency range is ascertained. FIG. 2B shows for that purpose and by way of example the acceleration, which is measured by an acceleration sensor, in a frequency range around 200 Hz (points in FIG. 2B).

A difference (continuous line in FIG. 2B) between the productive data set and the corresponding values calculated in accordance with the model is determined (points in FIG. 2B). The difference is then to be regarded as a measure for the state of the operating means.

The system can optionally propose or initiate an action independently of evaluation of the state, for example maintenance of the operating means or separation of the operating means from the mains.

In order to improve the state evaluation, the difference can optionally also be performed for a plurality of characteristic frequencies or a frequency range.

The reference signal and/or the productive signal can, for example, be stored by the measuring device M or the evaluating device A, for example in wave file format.

In addition, several sound transducers or acceleration sensors can optionally be used for detecting the acoustic signals so as to improve the accuracy and validity of the method.

In addition, it can be advantageous to detect as many different operating variables of the operating means as possible and to include them in the regression analysis so as to improve the accuracy thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE NUMERALS

TR operating means
T tank
K core
W windings
SS tap changer
A evaluating device
M measuring device
SW sound transducer or acceleration sensor
UE sensor or monitoring device

The invention claimed is:

1. A system for analysis of a state of an inductive operator, which is a transformer or a choke, the system comprising:
    a measuring device configured to:
        detect an acoustic reference signal and a plurality of time-variable operating variables, including a tap changer position, of the inductive operator or a reference inductive operator during a reference time period; and detect an acoustic signal and the time-variable operating variables, including the tap changer position, during a productive time period; and an evaluating device configured to:

generate a reference data set from the reference signal and a productive data set from the acoustic signal;

perform a regression analysis of the reference data set and thereby create a model for description of the acoustic reference signal by the time-variable operating variables, including the tap changer position; and generate a state evaluation of the inductive operator from a difference between the productive data set and values modelled in accordance with the model, wherein the inductive operator of the reference inductive operator comprises winding taps and a tap changer configured to switch over between the winding taps, and wherein the tap changer position indicates which of the winding taps is currently selected by the tap changer.

2. The system according to claim 1, wherein the measuring device comprises a sound transducer or an acceleration sensor for detection of the acoustic signal, the sound transducer of the acceleration sensor being arranged at the inductive operator or in an interior of the inductive operator or at an active part of the inductive operator.

3. The system according to claim 1, wherein the measuring device comprises at least one sensor or at least one monitoring device for detection of the operating variables.

4. The inductive operator comprising the system for state analysis in accordance with claim 1.

5. A method for analysis of a state of an inductive operator, which is a transformer or a choke, the method comprising:

detecting an acoustic reference signal and a plurality of time-variable operating variables, including a tap changer position, of the inductive operator or a reference inductive operator during a reference time period;

generating a reference data set from the reference signal;

creating a model for description of the acoustic reference signal according to the time-variable operating variables, including the tap-changer position, the creation of the model comprising regression analysis of the reference data sets;

detecting an acoustic signal and the time-variable operating variables, including the tap changer position, during a productive time period and generating a productive data set from the acoustic signal; and generating a state evaluation of the inductive operator from a difference between the productive data set and values modelled in accordance with the model, wherein the tap changer position indicates which of a plurality of winding taps is currently selected by a tap changer for the inductive operator or the reference inductive operator, the tap changer being for switching over between the winding taps.

6. The method according to claim 5, additionally comprising proposal, introduction, or undertaking, of an action at the inductive operator in dependence on a result of the state evaluation.

7. The method according to claim 5, additionally comprising:

detecting at least one further acoustic signal and the operating variables during at least one further respective productive time period;

generating at least one further productive data set from the at least one further acoustic signal; and generating at least one further state evaluation of the inductive operator from differences between the at least one further productive data set and values modelled in accordance with the model.

8. The method according to claim 7, additionally comprising:

updating the reference data set on the basis of the productive data set or the at least one further productive data set; and updating the model by a regression analysis of the updated reference data set.

9. The method according to claim 5, wherein the detection of the acoustic signal is carried out by a sound transducer or an acceleration sensor, which is arranged at the inductive operator or in the interior of the inductive operator or at an active part of the inductive operator.

10. The method according to claim 5, wherein the generation of the productive data set comprises determination of a characteristic data set which corresponds with the course over time of the amplitude of a predetermined frequency component of the acoustic signal.

11. The method according to claim 5, wherein the detection of the operating variables is carried out by at least one sensor or at least one monitoring device.

12. The method according to claim 5, wherein the operating variables comprise at least one of the following variables of the inductive operator or the reference inductive operator:

an insulator temperature;
a hot-spot temperature;
a winding temperature;
an ambient temperature;
a load current.

13. The method according to claim 5, wherein the regression analysis comprises a linear regression analysis.

14. The system according to claim 1, wherein the evaluating device is further configured to automatically separate the inductive operator from an energy supply network based on the state evaluation.

* * * * *